United States Patent
Hamaguchi et al.

(10) Patent No.: US 6,660,093 B2
(45) Date of Patent: Dec. 9, 2003

(54) INNER TUBE FOR CVD APPARATUS

(75) Inventors: Maki Hamaguchi, Kobe (JP); Takahiro Kobayashi, Kobe (JP)

(73) Assignee: Kabushiki Kaisha Kobe Seiko Sho (Kobe Steel, Ltd.), Kobe (JP)

( * ) Notice: Subject to any disclaimer, the term of this patent is extended or adjusted under 35 U.S.C. 154(b) by 0 days.

(21) Appl. No.: 09/863,383

(22) Filed: May 24, 2001

(65) Prior Publication Data

US 2002/0017242 A1 Feb. 14, 2002

(30) Foreign Application Priority Data

| May 25, 2000 | (JP) | ........................................ | 2000-155386 |
| May 25, 2000 | (JP) | ........................................ | 2000-155387 |
| Nov. 2, 2000 | (JP) | ........................................ | 2000-335750 |

(51) Int. Cl.$^7$ ........................................... C23C 16/000
(52) U.S. Cl. ........................................... 118/715
(58) Field of Search ................... 118/722, 715

(56) References Cited

U.S. PATENT DOCUMENTS

| 3,854,979 | A | * | 12/1974 | Rossi | ..................... | 117/46 CC |
| 5,807,416 | A |   | 9/1998  | Kemmochi et al. | | |
| 5,833,754 | A | * | 11/1998 | Ito et al. | ..................... | 118/725 |
| 5,952,060 | A | * | 9/1999  | Ravi | ........................... | 427/577 |
| 6,150,023 | A | * | 11/2000 | Yasaka et al. | .............. | 428/408 |
| 6,383,333 | B1 | * | 5/2002 | Haino et al. | ................. | 156/345 |

FOREIGN PATENT DOCUMENTS

| EP | 0 803 896 | * | 10/1997 | ............ H01J/37/32 |
| JP | 60-035333 | * | 2/1985 | ............ G11B/5/84 |
| JP | 4-149067 |   | 5/1992 | |
| JP | 04-210860 | * | 7/1992 | ......... B22D/13/010 |
| JP | 6-247770 |   | 9/1994 | |
| JP | 07-149583 | * | 6/1995 | ............ C04B/41/87 |
| JP | 08-120471 | * | 5/1996 | ............. C23F/4/00 |
| JP | 09-139330 | * | 5/1997 | ............ H01L/21/02 |
| JP | 09-275092 | * | 10/1997 | ....... H01L/21/3065 |
| JP | 10-291813 | * | 11/1998 | ............ C01B/31/02 |
| JP | 11-312646 | * | 11/1999 | ......... H01L/21/205 |

* cited by examiner

*Primary Examiner*—Gregory Mills
*Assistant Examiner*—Karla Moore
(74) *Attorney, Agent, or Firm*—Oblon, Spivak, McClelland, Maier & Neustadt, P.C.

(57) ABSTRACT

Disclosed herein is an inner tube for CVD apparatus which is made of glass-like carbon. This inner tube has good heat resistance and good corrosion resistance. It also has an inside surface for good adhesion with CVD film constituents. Therefore, it hardly contaminates silicon wafers during the production of semiconductors. The inner tube is characterized by a specific coefficient of thermal expansion, a specific surface roughness of its inside surface, a specific oxygen/carbon atomic ratio (O/C) of its inside surface, and a specific I(D)/I(G) ratio of its inside surface, where I(D) is a peak intensity representing the C—C bond of diamond-like structure and I(G) is a peak intensity representing the C—C bond of graphite-like structure.

16 Claims, 4 Drawing Sheets

INNER TUBE FOR CVD APPARATUS

BACKGROUND OF THE INVENTION

1. Field of the Invention

The present invention relates to an inner tube for CVD apparatus used for the production of semiconductors. More particularly, the present invention relates to an inner tube for CVD apparatus which effectively prevents the occurrence of particles which causes contamination to silicon wafers.

2. Description of the Related Art

The production of semiconductor devices conventionally relies on the so-called chemical vapor deposition method (CVD method for short hereinafter) which brings about gas-phase chemical reactions of more than one kind of compound gas to deposit silicon, silicon nitride, etc. in thin film on wafers. The CVD method employs a fixture called an inner tube which is so arranged as to surround silicon wafers as shown in FIG. 1. It regulates the flow of reactant gases and keeps the wafer temperature uniform.

Since the CVD method for the production of silicon semiconductor devices handles corrosive reactant gases (such as $SiH_4$) at high temperatures, the above-mentioned inner tube needs good heat resistance, corrosion resistance, and mechanical strength. The inner tube meeting these requirements has conventionally been made of quartz.

The production of semiconductor devices needs a clean environment to avoid contamination with impurities as far as possible. However, this requirement is not fully met by the conventional CVD method mentioned above, which consists of feeding a reactant gas from a gas inlet nozzle 5 into a sealed container in which are placed wafers 3 as shown in FIG. 1. In the sealed container, CVD takes place not only on wafers but also on the inside surface of the inner tube 1. (Those materials constituting the deposited film on the inner tube are referred to as CVD film constituents hereinafter.) For efficient production, the inner tube carrying CVD film constituents is used repeatedly without being renewed. After repeated use, CVD film constituents gradually accumulate to such an extent that they peel off from the inner tube and stick (in the form of fine particulate impurities) to wafers, thereby decreasing yields.

The conventional way to prevent the occurrence of such particles is to remove deposits by periodical cleaning of the inner tube with a chemical solution such as hydrofluoric acid and nitric acid. Frequent cleaning operations lower productivity and increase production cost. Moreover, cleaning with hydrofluoric acid reduces the life of quartz inner tubes because of its vigorous corrosive action. This necessitates frequent replacement and hence increases production cost.

New inner tubes are made of silicon carbide so that they resist not only corrosive gases such as $SiH_4$ used for the production of semiconductor devices but also cleaning chemical solutions. However, there still remains the unsolved problem with particles arising from CVD film constituents.

The inner tube used to produce semiconductors by the CVD method needs not only good heat resistance and corrosion resistance but also a specific inside surface which prevents CVD film constituents from peeling off, thereby reducing the frequency of maintenance work to remove deposited film.

With the foregoing in mind, the present inventors carried out researches on the production of inner tubes from glass-like carbon having good performance. As the result, it was found that a tube of glass-like carbon having good heat resistance and corrosion resistance can be obtained by the following process. First, a thermosetting resin is prepared as a precursor of the glass-like carbon. This thermosetting resin has such curing characteristics that it reaches a degree of cure of 10% at 115° C. within 5–60 minutes ($T_{10}$). It also exhibits such fluidity that it flows more than 60 mm at 100° C. in the disk flow test according to JIS K6911. Then, this thermosetting resin is made into a tube by centrifugal molding, and the resulting tube is carbonized. A patent application for this invention has been applied.

In their continued research, the present inventors found that the inner tube of glass-like carbon used in the CVD apparatus for semiconductor production should have specific physical properties so that it will not contaminate silicon wafers with microparticles peeling off from CVD film constituents which have accumulated on the inside surface of the inner tube during the CVD process.

The present invention was completed to tackle this problem. It is an object of the present invention to provide an inner tube for CVD apparatus which possesses not only good heat resistance and corrosion resistance but also specific physical properties contributing to good adhesion between its inside surface and CVD film constituents, thereby suppressing the occurrence of particles and the contamination of silicon wafers with particles.

SUMMARY OF THE INVENTION

The present invention is directed to an inner tube for CVD apparatus which is made of glass-like carbon. The inner tube possesses at least one of the following four characteristic properties. The present invention is directed also to a carbon-based inner tube for CVD apparatus which is coated with a film of glass-like carbon. The inner tube also possesses at least one of the following four characteristic properties.

(1) The inner tube has a coefficient of thermal expansion ranging from $2\times10^{-6}$ to $3.5\times10^{-6}$.

(2) The inner tube has an inside whose surface roughness is 5–100 nm (measured according to JIS B0651 and JIS B0601).

(3) The inner tube has an inside surface on which the oxygen/carbon atomic ratio (O/C) is 0.04–0.4 (measured by X-ray photoelectron spectroscopy).

(4) The inner tube has an inside surface which gives an I(D)/I(G) ratio ranging from 0.8 to 1.4 in Raman spectroscopy. The I(D)/I(G) ratio is an index showing the chemical structure of the inside surface, with I(D) being a peak intensity representing the C—C bond of diamond-like structure and I(G) being a peak intensity representing the C—C bond of graphite-like structure.

DETAILED DESCRIPTION OF THE INVENTION

Figure 1:
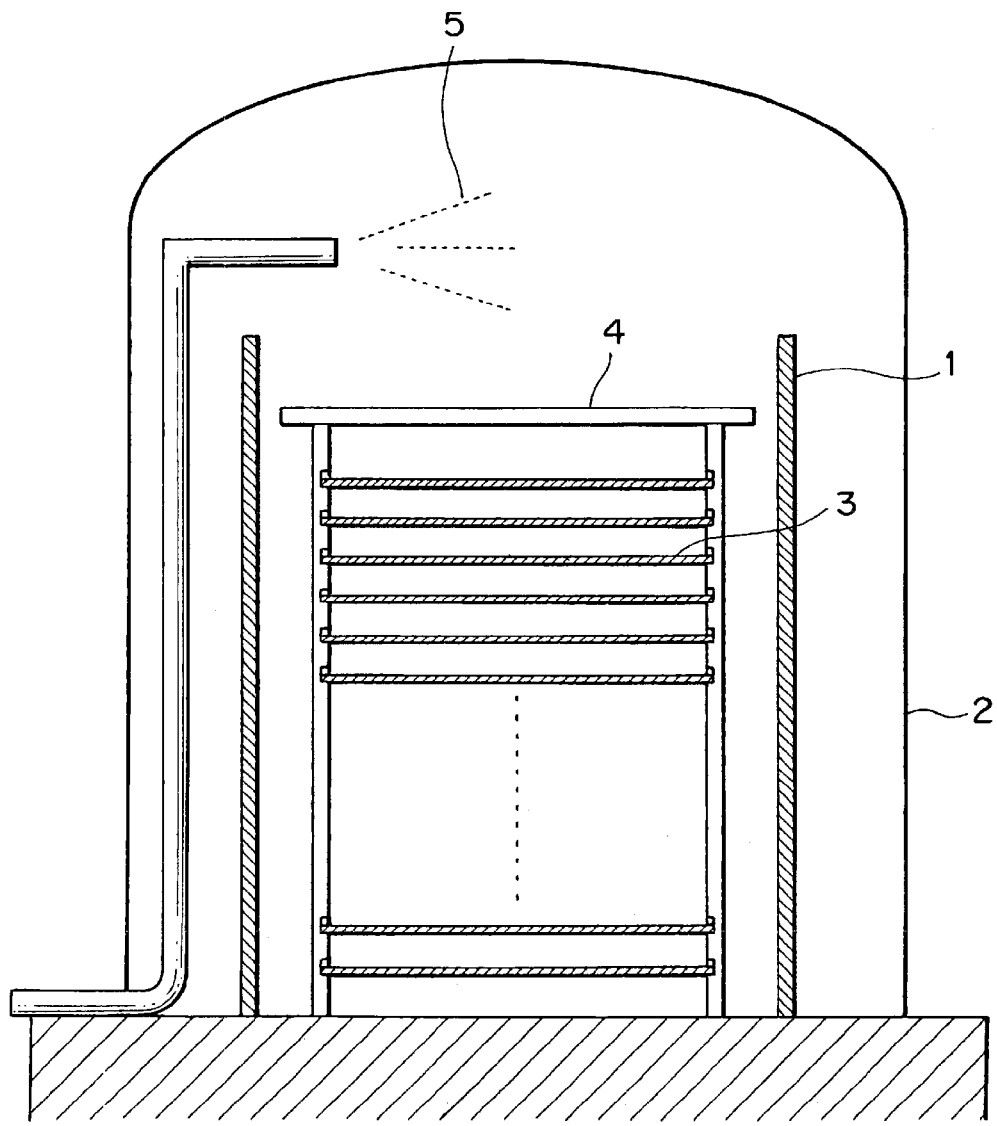
FIG. 1 is a schematic sectional view illustrating a CVD apparatus for semiconductor production.

As mentioned above, the general CVD method with quartz tube always involves the essential problem that CVD film constituents accumulate on the surface of the inner tube and their accumulate subsequently peels off, giving rise to fine particles which contaminate silicon wafers. The present inventors endeavored to develop a new inner tube for CVD which protects silicon wafers from contamination with such particles to the utmost and offer larger continuous usage period with maintenance-free. As the result, it was found that the object is achieved if the inner tube is made of glass-like carbon having specific physical properties. The present invention is based on this finding.

According to the present invention, the inner tube for CVD apparatus for semiconductor production is made of glass-like carbon. For better adhesion to CVD film constituents (which in turn prevents the occurrence of particles), the glass-like carbon should have the characteristic properties which are specified as follows.

(1) The inner tube should have a coefficient of thermal expansion ranging from $2\times10^{-6}$ to $3.5\times10^{-6}$.

It was noticed that contamination of silicon wafers with particles is due partly to the temperature change that takes place in a series of CVD steps. That is, chemical vapor deposition is usually carried out at 500–600° C., and the temperature of wafers being discharged from the CVD apparatus decreases to room temperature. This temperature change brings about expansion and contraction which exert tensile stress or compressive stress to the CVD film constituents if there is a large difference in coefficient of thermal expansion between the inner tube and the CVD film constituents. The result is the peeling off of the CVD film constituents from the inside surface of the inner tube and the occurrence of particles.

The present inventors' investigation revealed that quartz ($SiO_2$) and silicon carbide (SiC) as the conventional materials for the inner tube have coefficients of thermal expansion of $0.5\times10^{-6}$ and $4.5\times10^{-6}$, respectively, whereas polysilicon (Si) and silicon nitride ($Si_3N_4$) as typical CVD film constituents have coefficients of thermal expansion of $3.9\times10^{-6}$ and $2.6\times10^{-6}$, respectively. In other words, it was found that quartz and silicon carbide greatly differ in coefficient of thermal expansion from polysilicon and silicon nitride as CVD film constituents.

It is expected, therefore, that if the inner tube is made of a material having a coefficient of thermal expansion close to that of CVD film constituents, then the possibility that CVD film constituents peel off from the surface of the inner tube and contamination with particles occurs, can be significantly reduced even in an environment where a large temperature difference exits as mentioned above.

Consequently, according to the present invention, it is necessary that the inner tube made of glass-like carbon have a coefficient of thermal expansion close to that of Si and $Si_3N_4$ as CVD film constituents. Meeting this requirement results in decrease in peeling off of CVD film constituents. The inner tube should have a coefficient of thermal expansion larger than $2\times10^{-6}$ (preferably larger than $2.5\times10^{-6}$) and smaller than $3.5\times10^{-6}$ (preferably smaller than $3.1\times10^{-6}$).

Incidentally, the coefficient of thermal expansion is measured according to JIS 1618 "Method for measuring thermal expansion by thermal mechanical analysis", and it is expressed in terms of an average between T1=25° C. and T2=600° C.

The inner tube of glass-like carbon having a coefficient of thermal expansion specified above is produced from a phenolic resin (powder or liquid) by baking at 800–2600° C., preferably 1000–2000° C.

(2) The inner tube should have an inside whose surface roughness is 5–100 nm, measured according to JIS B0651 and JIS B0601.

The present inventors' investigation on the occurrence of particles revealed that one cause for this trouble is insufficient adhesion strength between the inside surface of the inner tube of quartz or silicon carbide and the CVD film constituents such as polysilicon and silicon nitride. Their research on materials for good adhesion with CVD film constituents revealed that good adhesion is attained if the inside surface of the inner tube of glass-like carbon has an adequately roughened surface. Such a rough surface helps CVD film constituents to bond firmly and prevents them from peeling off.

Incidentally, Japanese Patent Laid-open No. 77534/1997 discloses a quartz product whose inner surface is covered with glass-like carbon; however, it discloses nothing about the surface roughness of the glass-like carbon. The present inventors tested the coating film (0.8 µm thick) of glass-like carbon on the quartz product according to the disclosure. However, the result was rather negative.

The present inventors investigated the relation between the surface state of the inner tube of glass-like carbon and the adhesion of CVD film constituents to the inner tube. The investigation revealed that the desired surface roughness is obtained if the resin (as a precursor of glass-like carbon) is carbonized in such a way that its "natural surface" in its molten state or liquid state is maintained. The rough surface obtained in this manner produces a good physical anchorage effect, thereby improving adhesion to CVD film constituents and suppressing particles.

According to the present invention, the inner tube of glass-like carbon should have a specific surface roughness ranging in averaged roughness from 5 nm to 100 nm, where the averaged roughness is measured according to JIS B0651 and JIS B0601.

If this averaged roughness is smaller than a certain limit, the inner tube does not have good adhesion but permits the CVD film constituents to peel off. Therefore, averaged roughness (Ra) should be greater than 5 nm, preferably greater than 10 nm. If this averaged roughness is larger than a certain limit, the inner tube causes its surface layer to peel off due to excessive surface defects. Therefore, the averaged roughness (Ra) should be smaller than 100 nm, preferably smaller than 60 nm. Incidentally, the method for measuring Ra is mentioned later.

The desired averaged roughness is obtained if the inner tube is formed by centrifugal molding (followed by post-baking) from a resin which is inherently liquid or temporarily liquid at the time of molding. Alternatively, it is also obtained by cutting minute grooves in the inside surface of the inner tube. Such grooves should run in the direction perpendicular to the length of the inner tube. A probable reason for this is that the inner tube undergoes dimensional changes predominantly in its lengthwise direction.

In addition, the cutting of such grooves may be accomplished before the molded product of resin is cured or after the molded product of resin has been cured or post-baked.

It is also possible to obtain the desired averaged roughness by surface grinding. However, this method is not desirable because of the possibility of it causing contamination, strain, and scratches. Centrifugal molding from the above-mentioned liquid resin is most desirable to obtain the inner tube having the specified averaged roughness.

(3) The inner tube should have an inside surface on which the oxygen/carbon atomic ratio (O/C) is 0.04–0.4 (measured by X-ray photoelectron spectroscopy).

It was noticed that adhesion of CVD film constituents to the inner tube of glass-like carbon is affected by the oxygen content on the inside surface of the inner tube. A low oxygen content is considered to be an indication of good chemical stability in the inside surface. The inside surface in this state permits CVD film constituents (such as polysilicon and silicon nitride) to peel off easily, giving rise to particle formation. In order to avoid this situation, it is necessary to increase adhesion by causing the inside surface of the inner tube to contain a certain amount of oxygen, thereby increasing its activity and chemical affinity for CVD film constituents.

According to the present invention, the oxygen content on the inside surface of the inner tube is defined by the oxygen/carbon atomic ratio (O/C) measured by X-ray photoelectron spectroscopy. The O/C value should be larger than 0.04, preferably larger than 0.06.

If the O/C value is excessively large (that means the presence of excess oxygen on the inside surface of the inner tube), the inner tube evolves $CO_2$ gas and CO gas during the CVD process, thereby deteriorating devices and giving rise to particles (CVD film constituents peeling off at the time of degassing). Therefore, the O/C value should be smaller than 0.4, preferably smaller than 0.2.

The oxygen concentration in the inside surface of the inner tube may be adjusted in the following manner. Its increase may be accomplished by heat treatment in an oxidizing atmosphere (containing oxygen or the like), electrochemical oxidation, or dipping in a chemical solution such as concentrated nitric acid and bichromic acid. Its decrease may be accomplished by repeated heat treatment at a higher temperature which makes carbonization complete and eliminates residual oxygen-containing functional groups from the raw material resin.

(4) The inner tube should have an inside surface which gives a ratio of I(D)/I(G) ranging from 0.8 to 1.4 in Raman spectroscopy. The ratio of I(D)/I(G) is an index showing the chemical structure of the inside surface, with I(D) being a peak intensity representing the C—C bond of diamond-like structure and I(G) being a peak intensity representing the C—C bond of graphite-like structure.

It was noticed that the heat and corrosion resistance of the inner tube of glass-like carbon and the formation of particles depend greatly on the chemical structure of glass-like carbon in the inside surface of the inner tube.

According to the present invention, the chemical structure of glass-like carbon is characterized by the ratio of I(D)/I(G) in Raman spectroscopy. I(D) is a peak intensity representing the C—C bond of diamond-like structure and I(G) is a peak intensity representing the C—C bond of graphite-like structure. It was found that the inside surface of the inner tube has improved corrosion resistance and releases very few particles if it has a ratio of I(D)/I(G) within a certain range.

With an excessively small ratio of I(D)/I(G), the inside surface of the inner tube is poor in corrosion resistance and releases a large number of particles. The present invention requires that the ratio of I(D)/I(G) should be larger than 0.8, preferably larger than 0.9.

The inside surface of the inner tube with an excessively small ratio of I(D)/I(G) consists of more graphite-like structure rather than diamond-like structure. Consequently, it exhibits the properties of graphite to some extent. As a result, it is poor in adhesion with CVD film constituents and has poor corrosion resistance inherent in graphite.

With an excessively large ratio of I(D)/I(G), the inside surface of the inner tube readily releases particles. The present invention requires that the ratio of I(D)/I(G) should be smaller than 1.4, preferably smaller than 1.3.

The inside surface of the inner tube with an excessively large ratio of I(D)/I(G) has many chemically unstable (or active) bonds which are subject to decomposition during CVD process, releasing a large number of particles by itself.

Incidentally, the determination of I(D)/I(G) in Raman spectroscopy is based on the following principle. The Raman spectrum of a carbon sample has a Raman band (G band) at 1580 $cm^{-1}$ ascribed to the graphite-like structure. This G band shifts to a higher wave number (1600 $cm^{-1}$) as the crystallinity (degree of graphitization) decreases. The Raman spectrum also has a Raman band (D band) at 1360 $cm^{-1}$ ascribed to the diamond-like structure. The ratio of I(D)/I(G) is expressed in terms of the ratio of the area of G band to the area of D band. The areas of G band and D band are obtained by the curve fitting of signals with Lorentz function.

According to the present invention, the inner tube of glass-like carbon having the above-specified I(D)/I(G) ratio is produced from a phenolic resin by molding and ensuing carbonizing at 1000–2000° C. The inside surface of the inner tube should not undergo mirror finishing.

For the inner tube of glass-like carbon to exhibit good adhesion with CVD film constituents, it is necessary that at least one of the above-mentioned requirements be met and it is desirable that all of the above-mentioned requirements be met.

According to the present invention, the inner tube of glass-like carbon may be formed from any known thermosetting resin such as phenolic resin and furan resin in the form of solid or liquid, which is not specifically restricted. A preferred solid thermosetting resin is one which upon curing reaches a degree of cure of 10% at 115° C. within 5–60 minutes ($T_{10}$) and which flows more than 60 mm at 100° C. in the disk flow test according to JIS K6911. A preferred liquid thermosetting resin is one which takes 5–60 minutes for gelation. A liquid thermosetting resin with a gelation time shorter than 5 minutes cures before evolved gas dissipates. This leads to voids and cracks due to incomplete gas release. A liquid thermosetting resin with a gelation time longer than 60 minutes takes an extremely long molding time and evolves a large amount of gas (due to much volatile matter) at the time of molding. This results in a molded product having a poor surface state. Incidentally, the above-mentioned gelation time is measured at 115° C. according to JIS 6901. A preferred gelation time is 10–40 minutes.

The inner tube of glass-like carbon may be produced in the usual way which consists of two steps—molding and ensuing carbonization. Carbonization may be preceded by preheating to prevent the molded product from being strained.

In the production of the inner tube of glass-like carbon, the molding step is carried out such that the raw material resin is formed into a cylinder by centrifugal molding, injection molding, or extrusion molding, which are not specifically restricted. Of these molding methods, the centrifugal molding, in which the raw material resin is caused to flow along the inside of the mold by centrifugal force, is preferable because the resulting tubular molded product has a high dimensional accuracy and undergoes smooth degassing on account of its open inside.

Figure 2:
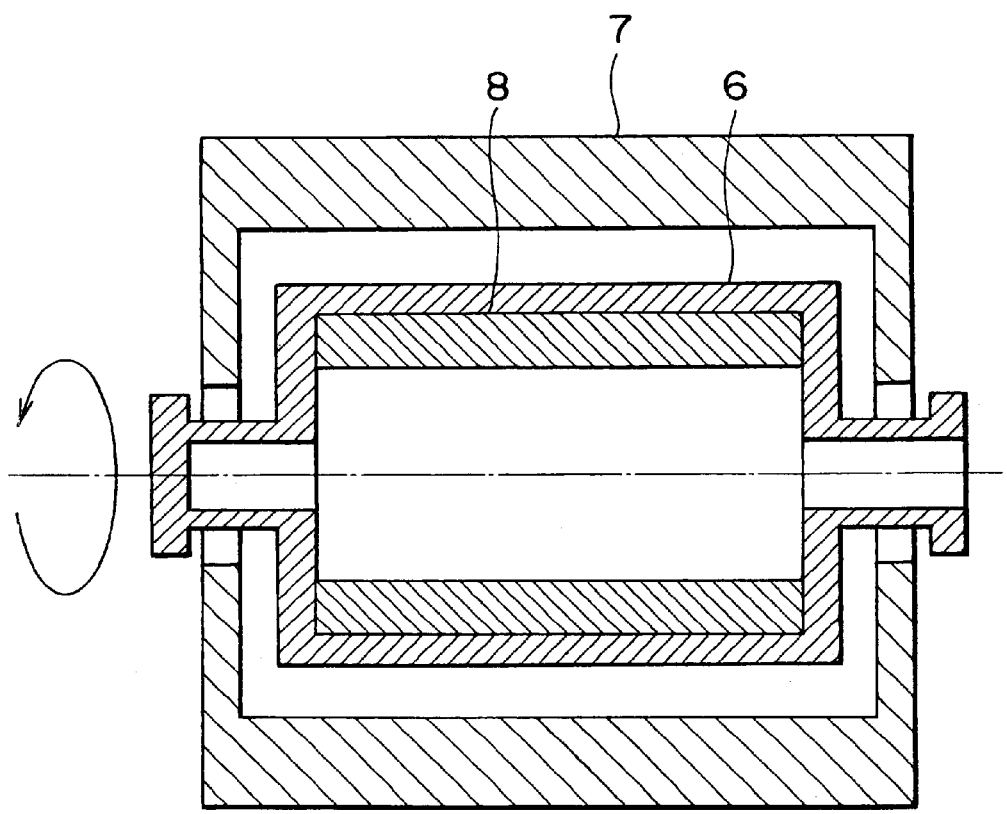
FIG. 2 is a schematic sectional view illustrating the centrifugal molding apparatus to produce the inner tube of the present invention.

It is recommended that centrifugal molding be carried out by using the centrifugal molding apparatus as shown in FIG. 2. In FIG. 2, there is shown a cylindrical mold 6 having, at least one of its ends, an opening which permits the discharge of gas evolved from the resin during its curing reaction. The mold 6 should be capable of high-speed rotation by a motor or pulley. The mold 6 may be of split type for easy demolding. The mold 6 may be made of metal, ceramics, or resin. Metal is preferable because of its high strength and good workability.

The raw material resin is charged into the mold 6 shown in FIG. 2. This step may be carried out while the mold is stationary or rotating. The rotation speed of the mold varies depending on the diameter of the mold and the properties and reactivity of the raw material resin. It should be high enough to produce a centrifugal force greater than 2 G, preferably greater than 10 G.

A preferred procedure according to the present invention is as follows. The mold for centrifugal molding is charged with the raw material resin 8. With the mold rotating, the resin is heated to a temperature at which the curing reaction proceeds. Heating is accomplished by means of a heating oven 7 surrounding the mold 6, as shown in FIG. 2. The raw material resin 8 having the above-mentioned properties becomes fluid as it is heated, and the resulting liquid resin receives centrifugal force generated by the rotation of the mold. As the result, the liquid resin becomes a pipe having a uniform wall thickness. Volatile matter and gas evolved during molding dissipate from the resin surface not in contact with the mold.

The mold used for centrifugal molding may have a roughened surface (in contact with the resin). The roughened surface permits efficient curing in a short time, yielding a pipe free of voids and cracks. The surface roughness of the inside of the mold should have a averaged roughness (Ra) of 1–10 μm and a maximum roughness (Rmax) of 10–50 μm. Ra and Rmax are measured according to JIS B0601 by using a Rank Taylor Hobson surface profiler.

The thermosetting resin should be heated according to an adequate heating pattern which varies depending on the shape of the pipe and the type of the thermosetting resin. A heating pattern for a liquid phenolic resin containing more than 70 wt % of nonvolatile matter is such that the charged phenolic resin cures to such an extent that the Barcol hardness is higher than 50 and the glass transition temperature (Tg) is higher than 130° C., and then the mold temperature is kept at 80–105° C. The mold is cooled for demolding. This heating pattern prevents defects (such as blisters) and permits the stable production of good pipes. Incidentally, the Barcol hardness is measured according to JIS K6911.

The thus obtained pipe of thermosetting resin is subsequently carbonized for conversion into a pipe of glass-like carbon. Carbonization should be carried out with a core (having a round cross-section) inserted in the pipe of thermosetting resin. It is desirable to place a compressible, heat-resistant cushioning material (such as carbon felt) between the core and the pipe inside. This cushioning material compensates for variation in shrinkage of the pipe of thermosetting resin, thereby giving a defect-free round pipe of glass-like carbon.

Figure 3:
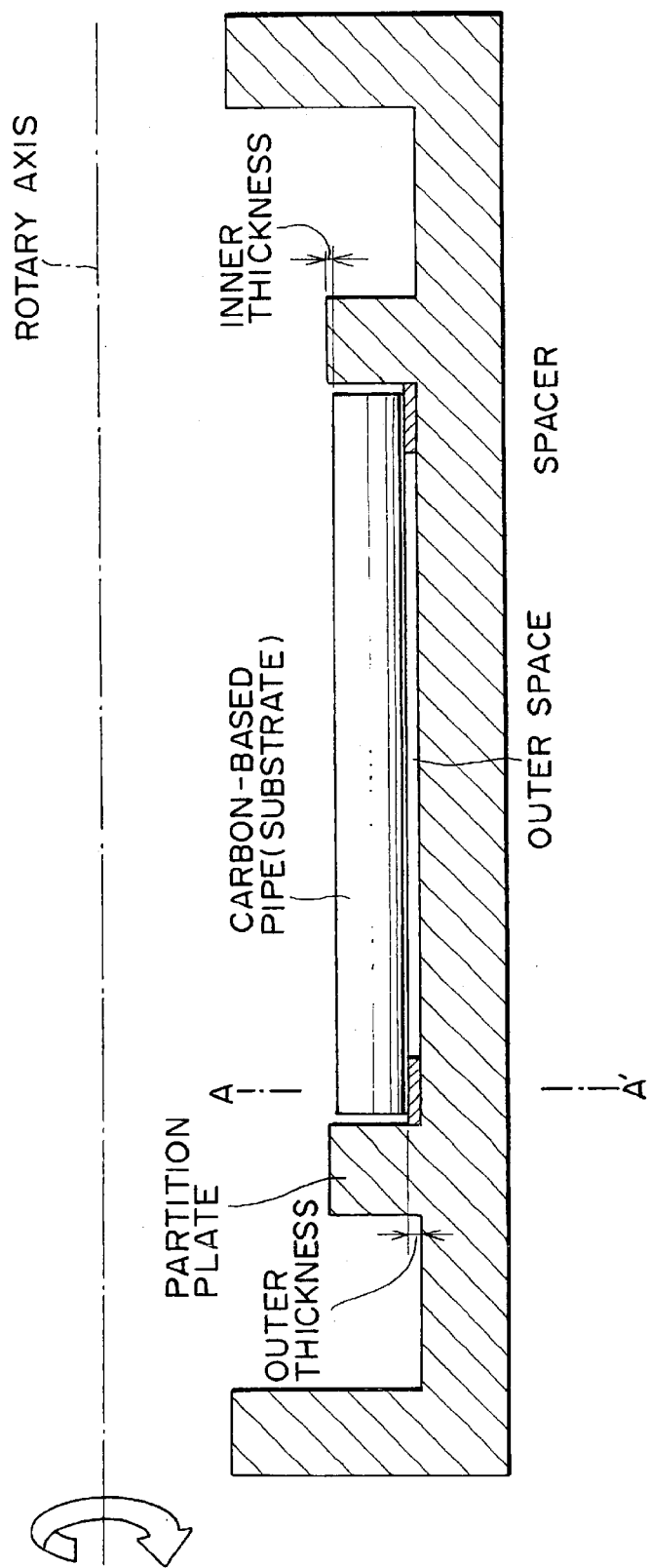
FIG. 3 is a schematic sectional view illustrating the centrifugal mold to produce the inner tube of the present invention.
Figure 4:
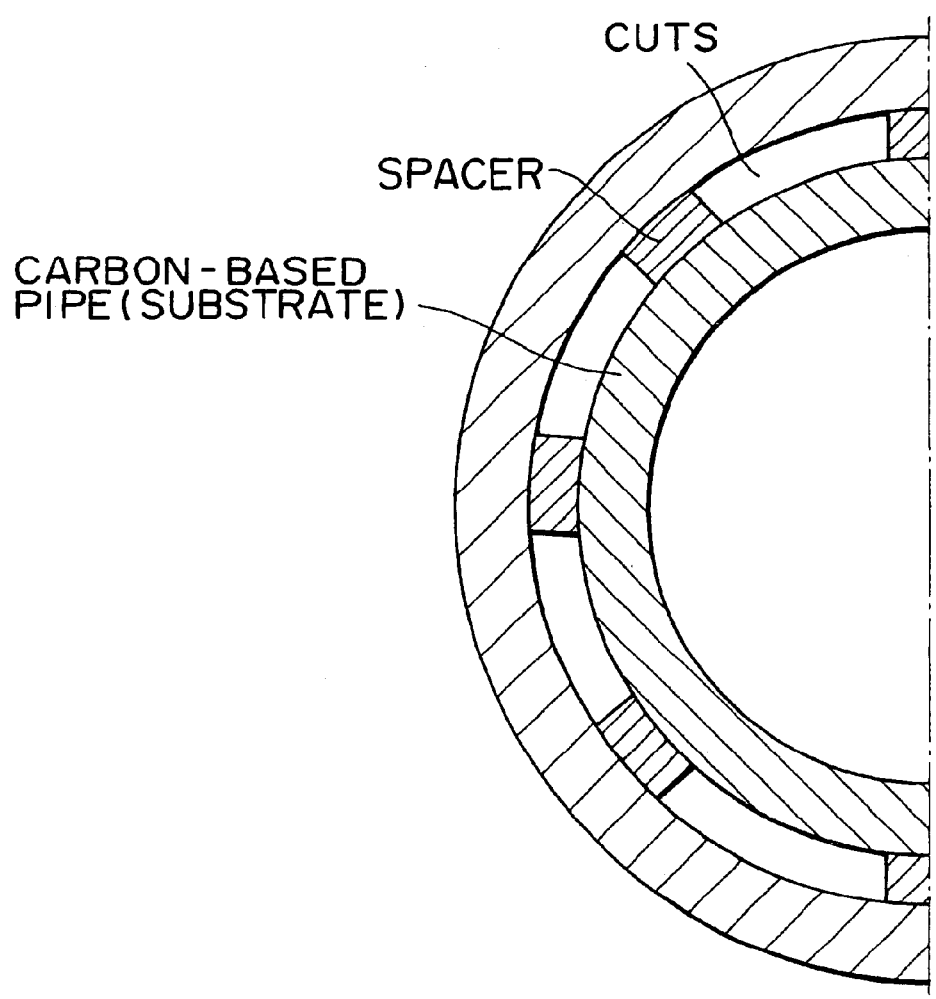
FIG. 4 is a sectional view of the mold taken along the line A–A' in FIG. 3.

According to another embodiment of the present invention, the inner tube for CVD apparatus is coated with a film of glass-like carbon. The inner tube of this type is produced by using a mold having a cross-section as shown in FIG. 3. Centrifugal molding with this mold gives a carbon-based pipe coated with glass-like carbon in a desired thickness. A practical procedure is as follows. First, a carbon-based pipe is mounted on the mold. A resin (such as phenolic resin) as a raw material of glass-like carbon is charged. The entire assembly is rotated and electrically heated. Thus there is obtained a carbon-based pipe coated (on both outside and inside) with a film of phenolic resin having a thickness as shown in FIG. 3. The coated carbon pipe is cured at 250° C. for 100 hours in air and then heated at 1000° C. for carbonization. In this way there is obtained a carbon-based pipe having a coating film of glass-like carbon. FIG. 4 is a sectional view of the mold taken along the line A–A' in FIG. 3. Incidentally, the spacer has cuts through which the resin flows into the outer space.

In addition, another possible advantage facilitated by the use of glass-like carbon as the material of inner tube is that the induction heating method can be used for hot CVD process. On the other hand, resistive heating has been generally used for the process. Glass-like carbon generates heat by itself on irradiation of electromagnetic wave with appropriate frequency. The induction heating via glass-like carbon can facilitate more uniform heat distribution in stacked silicon wafers in the equipment, which should result in improved yield of devices. Furthermore, induction heating may allow more rapid heating and/or cooling of silicon wafers, which can facilitates improvement of productivity of devices.

On the contrary, neither quartz nor silicon carbide which have been used as inner tube material, is active for induction heating.

EXAMPLES

The invention will be described in more detail with reference to the following examples, which are not intended to restrict the scope thereof. Various changes and modifications may be made in the invention without departing from the spirit and scope thereof.

Example 1

Demonstrating the Coefficient of Thermal Expansion (1-1) Preparation of Raw Material Resin A preferred thermosetting resin as a raw material of glass-like carbon is phenolic resin or furan resin. The one used in this example is a commercial phenolic resin BRL-240 made by Showa Kobunshi Co., Ltd.

(1-2) Molding Operation

Molding was accomplished by using a centrifugal molding machine equipped with a cylindrical mold, 2000 mm long and 325 mm in inside diameter, and an electric heater surrounding the mold. The mold was charged with 6 kg of the phenolic resin mentioned above. The mold was heated to 100° C. (measured at its inner surface) so as to melt the phenolic resin. The mold was rotated at 600 rpm for 10 hours, with its temperature kept at 100° C. After cooling to room temperature, the molded product of phenolic resin was removed from the mold.

The molded product of phenolic resin was a cylinder 2000 mm long, 2.5 mm thick, and 325 mm in outside diameter.

(1-3) Curing

The molded product of phenolic resin was heated in air at 300° C. for 40 hours. This heating step is intended to prevent the molded product from deforming in the subsequent carbonizing step; therefore, it may be omitted if there is no possibility of deformation.

(1-4) Carbonization

Five samples of molded products of phenolic resin were carbonized by heating at 800° C., 1100° C., 1600° C., 2100° C., and 2600° C., respectively, in an inert gas atmosphere. They became cylinders of glass-like carbon, each measuring 1600 mm long and 2.1 mm thick. Both ends of the cylinder were cut off to give a 1000-mm long inner tube for CVD apparatus.

(1-5) Evaluation

The coefficient of thermal expansion was measured according to JIS 1618 "Method for measuring thermal expansion by thermal mechanical analysis", and it was expressed in terms of an average of two values at T1=25° C. and T2=600° C.

The occurrence of particles was evaluated as follows. The inner tube obtained as above was mounted on a vertical LP-CVD apparatus. The apparatus was fed with a mixed gas of $SiH_4$ and $H_2$ at 650° C. to form a polysilicon film on silicon wafers. Each silicon wafer was examined to count the number of particles (larger than 0.2 μm) thereon by using "Surfscan" Model 6220 made by Tencor Co., Ltd. The results are shown in Table 1.

(2-2) Molding and Curing Operations

Molding and curing operations were carried out in the same way as in Example 1, except that the duration of rotation for molding was changed to 5 hours.

(2-3) Carbonization

Samples of molded products of phenolic resin were carbonized by heating at 1600° C. in an inert gas atmosphere. They became cylinders of glass-like carbon, each measuring 1600 mm long and 2.1 mm thick. Both ends of the cylinder were cut off to give a 1000-mm long inner tube for CVD apparatus.

(2-4) Evaluation

As in Example 1, the occurrence of particles was evaluated by forming polysilicon film on silicon wafers. The results are shown in Table 2.

TABLE 1

| Experiment No. | | 1 | 2 | 3 | 4 | 5 | Quartz | SiC |
|---|---|---|---|---|---|---|---|---|
| Temperature for carbonization (° C.) | | 800 | 1100 | 1600 | 2100 | 2600 | — | — |
| Coefficient of thermal expansion (×10$^{-6}$/° C.) | | 2.2 | 2.4 | 2.5 | 2.7 | 2.9 | 0.5 | 4.5 |
| Number of particles per wafer * | Average | 9 | 8 | 5 | 4 | 4 | 19 | 17 |
| | Minimum | 7 | 6 | 2 | 2 | 3 | 19 | 17 |
| | Maximum | 16 | 9 | 10 | 7 | 8 | 51 | 39 |

* Measurements of ten wafers.

It is noted from Table 1 that those samples in Experiment Nos. 1 to 5, which have a coefficient of thermal expansion in the range of $2 \times 10^{-6}$ to $3.5 \times 10^{-6}$, released very few particles contaminating the wafer surface. By contrast, the

TABLE 2

| Experiment No. | | 6 | 7 | 8 | 9 | 10 | 11 | 12 | Quartz | SiC |
|---|---|---|---|---|---|---|---|---|---|---|
| Raw materials | Phenolic resin | 100 | 100 | 100 | 100 | 100 | 100 | 100 | — | — |
| (parts by mass) | Hexamethylenetetramine | 2 | 4 | 6 | 8 | 2 | 2 | 2 | — | — |
| Grinding | | no | no | no | no | yes | yes | yes | — | — |
| averaged roughness | Measured length (0.4 mm) | 12 | 16 | 25 | 26 | 8 | 1.2 | 82 | 160 | 1300 |
| (nm) * | Measured length (1.25 mm) | 45 | 50 | 52 | 56 | 19 | 3.6 | 166 | 250 | 3800 |
| Number of particles | Average | 6 | 6 | 9 | 11 | 15 | 20 | 21 | 26 | 31 |
| per wafer ** | Minimum | 5 | 5 | 4 | 8 | 9 | 11 | 13 | 19 | 17 |
| | Maximum | 11 | 10 | 19 | 13 | 21 | 26 | 32 | 51 | 39 |

* Average of measurements at four points
** Measurements of ten wafers.

inner tubes made of quartz or silicon carbide, which have a coefficient of thermal expansion outside the range specified in the present invention, released a large number of particles.

Example 2

Demonstrating the Surface Roughness (2-1) Preparation of Raw Material Resin

As in Example 1 above, a commercial phenolic resin BRL-240 made by Showa Kobunshi Co., Ltd. was used. This phenolic resin was mixed with hexamethylenetetramine (HMT) as a catalyst in the ratio shown in Table 2. The resulting mixture was heated for reaction at 65° C. for 6 hours. Heating for dehydration was continued in a vacuum until the water content decreased to 5 mass % or less.

The inner tubes in Experiment Nos. 10 to 12 are identical with that in Experiment No. 6 except that their inside surface was ground in the usual way. The averaged roughness (Ra) was measured by a profile method by a Rank Taylor Hobson surface profiler. according to JIS B0651 and JIS B0601. (The probe has a radius of curvature of 5 μm.) The probe was run on a scratch-free surface in the direction parallel to the length of the inner tube.

It is noted from Table 2 that the inner tubes in Experiment Nos. 6 to 10, which have the value of Ra within the range specified in the present invention, released much fewer particles than the conventional inner tubes made of quartz or silicon carbide.

By contrast, the inner tube in Experiment No. 11 released many particles. A probable reason for this is that its surface has a value of Ra smaller than specified in the present invention and hence its surface is too smooth for CVD film constituents to firmly adhere thereto. The inner tube in Experiment No. 12 which had the surface with Ra of 166 nm also released many particles. A probable reason for this is micro-cracking that occurred at the time of grinding.

(2-5) Inner Tube With Its Inside Surface Made Rough By Forming Irregularities.

In this example, experiments were also carried out to see the effect of surface irregularities made on the inside surface of the inner tube. Samples were prepared in the same way as mentioned above. The sample in Experiment No. 13 was not given grinding. The sample in Experiment No. 14 was given grinding after the resin molding. The sample in Experiment No. 15 was given grinding after curing. The sample in Experiment No. 16 was given grinding after carbonization. Grinding was done by rotating the cylindrical product around its lengthwise axis.

The averaged roughness (Ra) was measured by a profile method using Rank Taylor Hobson surface profiler according JIS B0651 and JIS B0601. The probe was run in the direction parallel to the length of the inner tube. The results of measurements of surface roughness is shown in Table 3.

TABLE 3

| Experiment No. | | 13 | 14 | 15 | 16 | Quartz | SiC |
|---|---|---|---|---|---|---|---|
| Grinding | | no | After molding | After curing | After carbonization | no | no |
| averaged roughness (nm) * | Length of measurement (0.4 mm) | 26 | 890 | 920 | 1100 | 160 | 1300 |
| | Length of measurement (1.25 mm) | 56 | 1600 | 1650 | 1800 | 250 | 3800 |
| Number of particles per wafer ** | Average | 11 | 18 | 22 | 21 | 26 | 31 |
| | Minimum | 8 | 11 | 9 | 15 | 19 | 17 |
| | Maximum | 13 | 26 | 28 | 36 | 51 | 39 |

\* Average of measurements at four points
\*\* Measurements of ten wafers

Example 3

Demonstrating the Oxygen Concentration in the Surface (3-1) Preparation of Raw Material Resin As in Example 1 above, a commercial phenolic resin BRL-240 made by Showa Kobunshi Co., Ltd. was used. This phenolic resin was mixed with hexamethylenetetramine (HMT) as a catalyst in an amount of 8 parts by mass for 100 parts by mass of the phenolic resin. The resulting mixture was heated for reaction at 65° C. for 6 hours. Heating for dehydration was continued in a vacuum until the water content decreased to 5 mass % or less.

(3-2) Molding and Curing Operations

Molding and curing operations were carried out in the same way as in Example 1, except that the duration of rotation for molding was changed to 5 hours.

(3-3) Carbonization

Four samples of molded products of phenolic resin were carbonized by heating at 1000° C., 1500° C., 2000° C., and 2500° C., respectively, in an inert gas atmosphere. They became cylinders of glass-like carbon, each measuring 1600 mm long and 2.1 mm thick. Both ends of the cylinder were cut off to give a 1000-mm long inner tube for CVD apparatus.

One inner tube was prepared separately by carbonization at 2500° C. It underwent electrolytic oxidation for 5 minutes or 20 minutes in an NaOH aqueous solution (0.1 mol) with a current of 20 mA/cm$^2$.

(3-4) Evaluation

The thus obtained inner tube was ultrasonically cleaned in ethanol for about 5 minutes and then tested for the oxygen/carbon atomic ratio by using an X-ray photoelectron spectrophotometer under the following conditions. Apparatus: PHI5400MC, made by Perkin-Elmer Corp.

X-ray source: Mg K$_\alpha$
X-ray output: 400 W (15 kV 26.7 mA)
Region of analysis: 1.1 mm in diameter
Angle between sample and detector: 45°
Rate of Ar$^+$ sputtering: 20 Å/minute in terms of SiO$_2$ Table 4 shows the manufacturing conditions, the results of XPS analysis, and the results of evaluation.

TABLE 4

| Experiment No. | | 17 | 18 | 19 | 20 | 21 | 22 | Quartz | SiC |
|---|---|---|---|---|---|---|---|---|---|
| Carbonization temperature (° C.) | | 1000 | 1500 | 2000 | 2500 | 2500 | 2500 | — | — |
| Duration of electrolytic oxidation (minutes) | | 0 | 0 | 0 | 0 | 5 | 20 | — | — |
| O/C ratio | Outermost surface | 0.08 | 0.06 | 0.05 | 0.02 | 0.11 | 0.49 | — | — |
| | At depth of 0.5 nm * | 0.04 | 0.02 | 0.02 | 0 | 0.09 | 0.18 | — | — |
| | At depth of 5 nm * | 0.03 | 0.01 | 0.01 | 0 | 0 | 0.07 | — | — |
| Number of particles per wafer ** | Average | 7 | 8 | 11 | 33 | 14 | 52 | 26 | 31 |
| | Minimum | 6 | 5 | 3 | 27 | 12 | 26 | 19 | 17 |
| | Maximum | 11 | 10 | 13 | 41 | 19 | 66 | 51 | 39 |

\* Analytical values inside the sample after argon plasma etching are shown for reference. The depth is based on the Si standard sample.
\*\* Measurements of ten wafers.

It is noted from Table 3 that the inner tubes in Experiment Nos. 14 to 16, which were given grinding (for groove-like irregularities in the direction perpendicular to the length of the inner tube), released fewer particles although they have the same surface roughness as that of the inner tube made of quartz or silicon carbide.

It is noted from Table 4 that the O/C ratio tends to decrease as the carbonization temperature increases. A probable reason for this is that the higher is the carbonization temperature, the more readily the oxygen atoms in the phenolic resin (as the raw material) are eliminated.

The samples in Experiment Nos. 17, 18, 19, and 21, which have the O/C ratio within the range specified in the present invention, released much fewer particles as compared with the conventional inner tube made of quartz or silicon carbide. In contrast, the sample in Experiment No. 20, which has the O/C ratio outside the range specified in the present invention, released a large number of particles.

The sample in Experiment No. 21, which underwent carbonization at a high temperature, released very few particles owing to the adequate electrolytic oxidation. The sample in Experiment No. 22, which underwent excessive electrolytic oxidation, released more particles than the inner tube made of quartz or silicon carbide.

Example 4

Demonstrating the Crystallinity (4-1) Preparation of Raw Material Resin

A commercial liquid phenolic resin PL-4804 made by Gun-ei Kagaku Co., Ltd. was used. This phenolic resin was mixed with hexamethylenetetramine (HMT) as a catalyst in an amount of 5 parts by mass for 100 parts by mass of the phenolic resin. The resulting mixture was mixed at 65° C. for 1 hour.

(4-2) Molding and Curing Operations

Molding and curing operations were carried out in the same way as in Example 1, except that the duration of rotation for molding was changed to 5 hours.

(4-3) Carbonization

Four samples of molded products of phenolic resin were carbonized by heating at 1000° C., 1500° C., 2000° C., and 3000° C., respectively, in an inert gas atmosphere. They became cylinders of glass-like carbon, each measuring 1600 mm long and 2.1 mm thick. Both ends of the cylinder were cut off to give a 1000-mm long inner tube for CVD apparatus.

The samples in Experiment Nos. 27 (mentioned later) is the same one as in Experiment No. 23 except that the inside surface is mirror-finished by polishing.

(4-4) Evaluation

As mentioned above, the Raman spectrum of a carbon sample gives a Raman band (G band) at 1580 cm$^{-1}$ ascribed to the graphite-like structure and a Raman band (D band) at 1360 cm$^{-1}$ ascribed to the diamond-like structure. The G band shifts to 1600 cm$^{-1}$ (high frequency) as the crystallinity (degree of graphitization) decreases.

In the present invention, the ratio of I(D)/I(G) is expressed in terms of the ratio of the area of G band to the area of D band. The areas of G band and D band are obtained by the curve fitting of signals with Lorentz function.

Incidentally, the Raman spectrophotometer used in this example was set under the following conditions. Apparatus: Laser Raman spectrophotometer, Model NR-1000, made by Nippon Bunko Co., Ltd.

Method of measurement: 90-degree scattering

Exciting light source: argon ion laser

Exciting wavelength: 488.0 nm

Exciting light output: 300 mW

Region of measurement: 1000–2000 cm$^{-1}$

Resolution: about 8 cm$^{-1}$

Table 5 shows the manufacturing conditions and the results of evaluation.

TABLE 5

| Experiment No. | | 23 | 24 | 25 | 26 | 27 * | Quartz | SiC |
|---|---|---|---|---|---|---|---|---|
| Carbonization temperature (° C.) | | 1000 | 1500 | 2000 | 3000 | 1000 | — | — |
| Ratio of I(D)/I(G) | | 1.31 | 0.88 | 0.98 | 0.76 | 1.92 | — | — |
| Number of particles per wafer ** | Average | 6 | 8 | 14 | 32 | 29 | 26 | 31 |
| | Minimum | 2 | 6 | 3 | 24 | 19 | 19 | 17 |
| | Maximum | 13 | 13 | 21 | 47 | 44 | 51 | 39 |

* Produced under the same condition as in Experiment No. 23, except that the inside surface is mirror-finished.
** Measurements of ten wafers.

The samples in Experiment Nos. 23 to 25, which have the ratio of I(D)/I(G) as specified in the present invention, released very few particles. By contrast, the sample in Experiment No. 26, which has the ratio of I(D)/I(G) outside the range specified in the present invention, released as many particles as or more particles than the inner tube made of quartz or silicon carbide. A probable reason for this is that the inner tube with a low ratio of I(D)/I(G) or a high ratio of C—C double bonds has such a weak chemical activity that it does not permit CVD film constituents to adhere firmly to it.

The sample in Experiment No. 27, which has the ratio of I(D)/I(G) exceeding the range specified in the present invention, released as many particles as the inner tube made of quartz or silicon carbide. A probable reason for this is that polishing disturbed the structure or the disturbed structure led to fine cracking and film peeling.

Example 5

Demonstrating the Carbon-Based Inner Tube Coated With a Film of Glass-Like Carbon The thermosetting resin as a raw material is PL-4804 (commercial phenolic resin) made by Gun-ei Kagaku Co., Ltd. The carbon base material is a commercially available pipe of isotropic carbon measuring 700 mm in length, 200 mm in outside diameter, and 4 mm in thickness.

The carbon pipe was coated with a thermosetting resin in the following manner by using a centrifugal molding machine equipped with a cylindrical rotary mold, 1000 mm long and 202 mm in inside diameter. (The rotary mold is surrounded by an electric heater.)

The carbon pipe was mounted on the rotary mold, and the rotary mold was charged with 500 g of liquid phenolic resin. The rotary mold was rotated at 500 rpm for 5 hours, with its temperature kept at 100° C. After cooling to room temperature, the carbon pipe coated with phenolic resin film was demolded. The thickness of the phenolic resin film was 1 mm on both the outside and the inside. This thickness was obtained by using 1-mm thick spacers shown in FIG. 3 and 6-mm high partition plates shown in FIG. 2.

The carbon pipe coated with a phenolic resin film was heated (for curing) in air at 250° C. for 100 hours.

After curing, the coated pipe was heated at 1000° C. so as to convert the phenolic resin film into a film of glass-like carbon. Thus there was obtained a carbon pipe coated with a film of glass-like carbon, which is the inner tube for CVD apparatus according to the present invention. The thus obtained inner tube was attached to a vertical LP-CVD apparatus. (LP=low pressure) The CVD apparatus was fed with a mixed gas of $SiH_4$ and $H_2$, with its temperature kept at 650° C., so as to form a polysilicon film on silicon wafers. The wafer surface was examined for the number of particles (larger than 0.2 μm) by using Surfscan. This measurement was made for 10 wafers.

For the purpose of comparison, the CVD process was repeated in the same way as mentioned above, except that the inner tube according to the present invention was replaced by a commercial inner tube made of quartz or silicon carbide. The resulting wafers were examined for the number of particles in the same as mentioned above.

The results are shown in Table 6.

TABLE 6

| Experiment No. | Number of particles per wafer (measured for 10 wafers) | | |
|---|---|---|---|
| | Average | Minimum | Maximum |
| 28 | 5 | 3 | 8 |
| quartz (for comparison) | 26 | 19 | 51 |
| SiC (for comparison) | 31 | 17 | 39 |

It is noted from Table 6 that the inner tube according to the present invention released by far less particles than the inner tube made of quartz or silicon carbide.

The CVD process with the inner tube according to the present invention was repeated five times. Despite repeated heating/cooling cycles, the coating film of glass-like carbon did not peel off at all.

The inner tube coated with a film of glass-like carbon in working example was immersed in a 1:1 mixture of hydrofluoric acid and nitric acid at 60° C. for 30 days. The inner tube lost weight less than 1 ppm. This suggests extremely good corrosion resistance. The coating film of glass-like carbon did not peel off at all. This suggests that the coating film firmly adheres to the substrate.

What is claimed is:

1. A conventional CVD chamber comprising an inner tube which is made of glass-like carbon, wherein the inner surface of said inner tube gives an oxygen/carbon atomic ratio (O/C) ranging from 0.04 to 0.4 measured by x-ray photoelectron spectroscopy.

2. The conventional CVD chamber of claim 1, wherein said inner tube is selectively attached to said conventional CVD chamber at a base of said inner tube.

3. The conventional CVD chamber of claim 1, wherein said inner tube has a coefficient of thermal expansion in the range of from $2 \times 10^{-6}$ to $3.5 \times 10^{-6}$.

4. The conventional CVD chamber of claim 1, wherein the inner surface of said inner tube has an average surface roughness of 5–100 nm measured according to JIS B0651 and JIS B0601.

5. The conventional CVD chamber of claim 1, wherein the inside surface of said inner tube gives a ratio of I(D)/I(G) ranging from 0.8 to 1.4 in Raman spectroscopy.

6. The conventional CVD chamber of claim 1, wherein said inner tube is formed by centrifugal molding.

7. A CVD chamber comprising an inner tube which is made of glass-like carbon, wherein said inner tube is selectively attached to said CVD chamber at a base of said inner tube, and wherein the inner surface of said inner tube gives an oxygen/carbon atomic ratio (O/C) ranging from 0.04 to 0.4 measured by x-ray photoelectron spectroscopy.

8. The CVD chamber of claim 7, wherein said inner tube has a coefficient of thermal expansion in the range of from $2 \times 10^{-6}$ to $3.5 \times 10^{-6}$.

9. The CVD chamber of claim 7, wherein the inner surface of said inner tube has an average surface roughness of 5–100 nm measured according to JIS B0651 and JIS B0601.

10. The CVD chamber of claim 7, wherein the inside surface of said inner tube gives a ratio of I(D)/I(G) ranging from 0.8 to 1.4 in Raman spectroscopy.

11. The CVD chamber of claim 7, wherein said inner tube is formed by centrifugal molding.

12. A conventional CVD chamber comprising an inner tube, wherein said inner tube comprises a carbon substrate with a film of glass-like carbon coated thereon, and wherein the inner surface of said inner tube gives an oxygen/carbon atomic ratio (O/C) ranging from 0.04 to 0.4 measured by x-ray photoelectron spectroscopy.

13. The conventional CVD chamber of claim 12, wherein said inner tube has a coefficient of thermal expansion in the range of from $2 \times 10^{-6}$ to $3.5 \times 10^{-6}$.

14. The conventional CVD chamber of claim 12, wherein the inner surface of said inner tube has an average surface roughness of 5–100 nm measured according to JIS B0651 and JIS B0601.

15. The conventional CVD chamber of claim 12, wherein the inside surface of said inner tube gives a ratio of I(D)/I(G) ranging from 0.8 to 1.4 in Raman spectroscopy.

16. The conventional CVD chamber of claim 12, wherein said inner tube is formed by centrifugal molding.

* * * * *